United States Patent
Moore et al.

(10) Patent No.: US 7,626,721 B2
(45) Date of Patent: Dec. 1, 2009

(54) DITHER METHODS FOR SUPPRESSION OF DATA-DEPENDENT ACTIVITY VARIATIONS

(75) Inventors: George S. Moore, Veradale, WA (US); Frank Van de Sande, Leuven (BE)

(73) Assignee: Agilent Technologies, Inc., Santa Clara, CA (US)

( * ) Notice: Subject to any disclaimer, the term of this patent is extended or adjusted under 35 U.S.C. 154(b) by 590 days.

(21) Appl. No.: 11/546,791

(22) Filed: Oct. 12, 2006

(65) Prior Publication Data

US 2008/0143565 A1 Jun. 19, 2008

(51) Int. Cl.
*G06K 1/00* (2006.01)
*G06K 15/02* (2006.01)
*G06F 15/00* (2006.01)

(52) U.S. Cl. .................................. 358/1.2; 358/1.1

(58) Field of Classification Search .................. 358/1.2, 358/1.13, 1.15, 1.9, 1.1, 530, 426.01
See application file for complete search history.

(56) References Cited

U.S. PATENT DOCUMENTS

| | | | |
|---|---|---|---|
| 4,845,498 A | 7/1989 | Kubo et al. | |
| 4,914,439 A | 4/1990 | Nakahashi et al. | |
| 4,994,803 A | 2/1991 | Blackham | |
| 5,818,372 A | 10/1998 | Noro | |
| 2004/0066363 A1* | 4/2004 | Yamano et al. | |
| 2006/0244690 A1* | 11/2006 | Osame et al. | |

FOREIGN PATENT DOCUMENTS

| | | |
|---|---|---|
| EP | 0398638 | 11/1990 |
| JP | 62207028 | 9/1987 |
| JP | 63033012 | 2/1988 |
| JP | 05152951 | 6/1993 |

OTHER PUBLICATIONS

GB Search Report under Section 17 dated Dec. 17, 2007.

* cited by examiner

*Primary Examiner*—Douglas Q Tran

(57) ABSTRACT

A system and method are provided for minimizing data-dependent power variations. The system and method can include summing an input with a dither signal, processing the summed signal, and substantially removing the effects of the dither signal from the output. The output is an approximation of processing to the input alone, while certain aspects of processing activity, such as temperature changes and current draw, are less dependent on input values. Variations in data-dependent activities are thus reduced. The effects of the dither signal may be removed by equivalently processing the dither signal alone, and using that result as a compensating signal to cancel components of the processed signal that result from the presence of the dither signal.

24 Claims, 3 Drawing Sheets

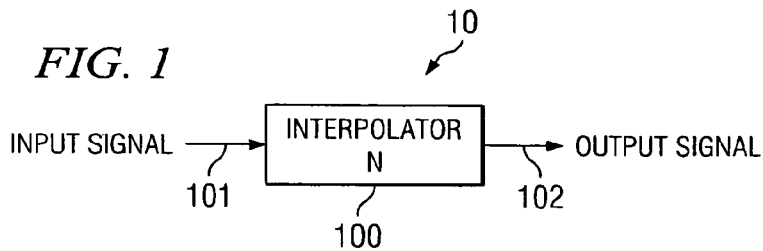
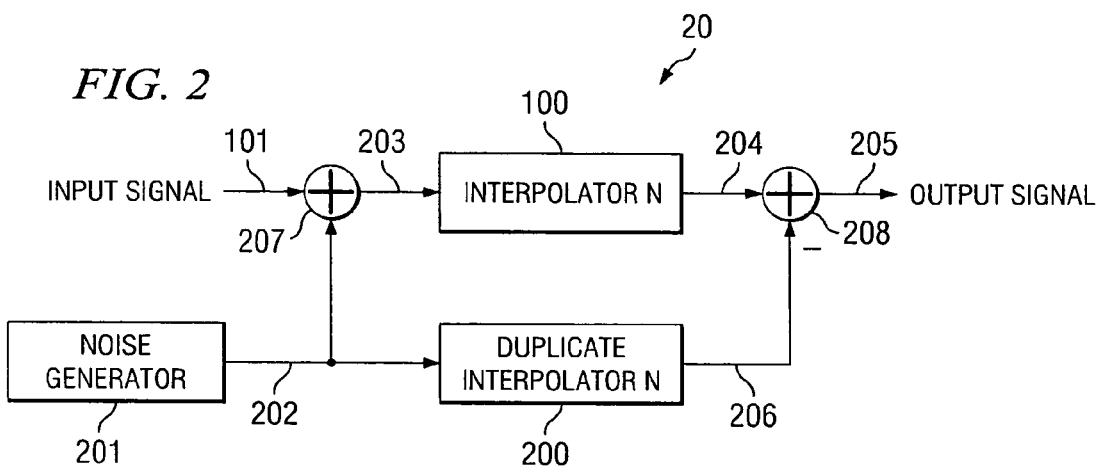
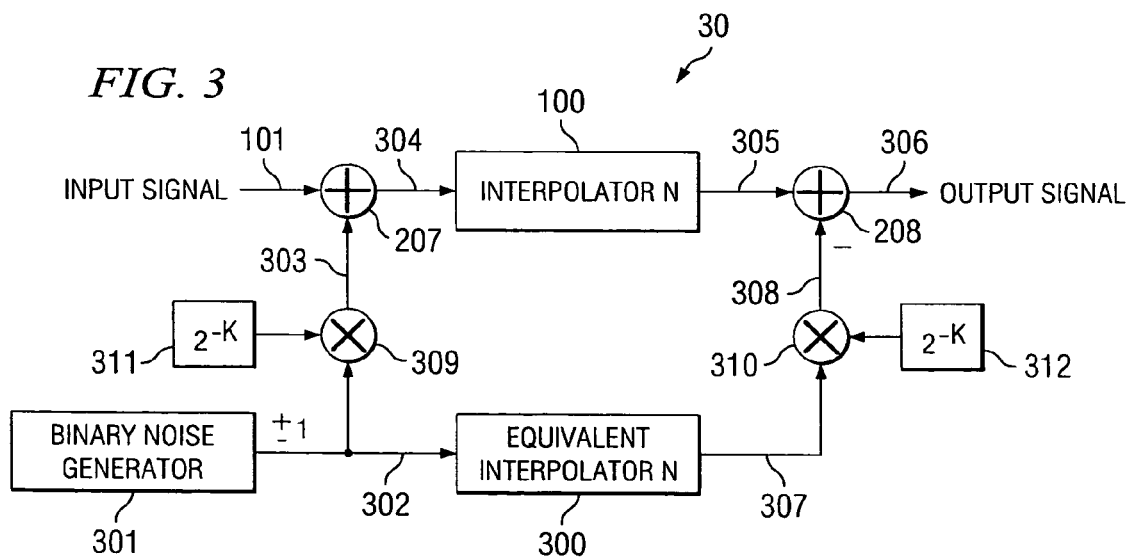

DITHER METHODS FOR SUPPRESSION OF DATA-DEPENDENT ACTIVITY VARIATIONS

FIELD OF THE INVENTION

The concepts described herein relate power dissipation in semiconductors, and more specifically to a system and method for minimizing data-dependent activity variations that can induce temperature variations in semiconductors, particularly mixed signal devices.

DESCRIPTION OF RELATED ART

In many semiconductor applications, particularly mixed signal devices such as digital-to-analog converters (DACs), analog to digital converts (ADCs), and other devices where both analog and digital components coexist, power consumption shifts may result in temperature changes or gradients within the device that could change the operating parameters, such as gain and offsets of the analog components. It can be, therefore, important to keep power dissipation in an application specific integrated circuit (ASIC) relatively constant to avoid variations in the operating temperature of a device. In most ASIC technologies, the power dissipation of the digital components is dependent on the activity of the signals, i.e. the transitions of the logic elements from one to zero and from zero to one, this can be referred to as the transition density.

In many applications the transition density is dependent on external signals being provided to the device. For example, the input signal to a DAC or ADC may not be constant, but rather may vary between periods of activity and inactivity. During the periods of inactivity the input signal may be essentially zero with little or no transition density. This variation in transition density can result in significant, signal dependent power variations within the device that can result in temperature shifts or gradients over the device, potentially degrading its performance.

What is needed is a system and method to minimize data dependent power variations over periods comparable to the thermal time constant of the device. These power variations, if not suppressed, could result in non-uniform power consumption by a device or portions of a device, which could lead to the build up of temperature variations in all or part of the device.

BRIEF SUMMARY OF THE INVENTION

In an embodiment according to the concepts described herein, a system for minimizing data-dependent activity variations is described. The system includes a first signal processing function and a dither generator. The dither signal generator operable to produce a dither signal, where the dither signal is summed with an input signal to create a dithered input signal. The dithered input signal processed by the first signal processing function. A second signal processing function is operable to act on the dither signal and produce a compensating signal for subtracting from the output of the first signal processing function, to remove effects of the dither signal from an output of the first signal processing function.

In another embodiment a method for minimizing variations in data-dependent activity when processing an input signal is described. The method includes summing said input signal with a dither signal to produce a dithered signal, processing said dithered signal to produce an output signal, and removing effects of said dither signal from said output signal.

In yet another embodiment a system for minimizing data-dependent power variations in a device receiving an input signal is described. The system includes a signal processing function and a dither generator producing a dither signal. A summer sums the input signal and the dither signal to produce a dithered input signal. The dithered input signal is then processed by the signal processing function resulting in a dithered output signal. A second signal processing function processes the dither signal to produce a processed dither signal, and a second summer subtracts the processed dither signal from the dithered output signal to produce an output signal.

BRIEF DESCRIPTION OF THE DRAWINGS

For a more complete understanding of the present invention, reference is now made to the following descriptions taken in conjunction with the accompanying drawings, in which:

FIG. 1 is a diagram of a electronic component that may exhibit data dependent activity variation;

FIG. 2 is a block diagram illustrating a system and method for alleviating data dependent activity variation in the electronic component of FIG. 1;

FIG. 3 is a block diagram illustrating an alternative system and method for alleviating data dependent activity variation in the electronic component of FIG. 1;

DETAILED DESCRIPTION OF THE INVENTION

Figure 4:
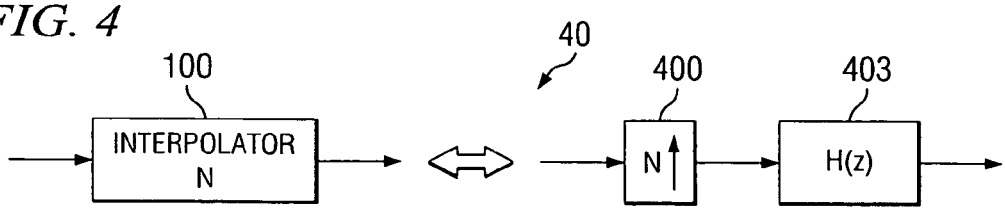
FIG. 4 is a block diagram illustrating a conceptual depiction of an interpolate-by-N function.

Referring now to FIG. 1, an example of a device which shows signal dependent activity variation is shown. High speed digital-to-analog conversion devices can include digital interpolation and rotation functions. FIG. 1 shows a model 10 of an interpolate-by-N function 100 having input signal 101 and output signal 102. As described, an interpolator, such as interpolator 100 in model 10, can exhibit data dependent variations in power consumption, which can cause changes in the operating temperature of the device, or temperature gradients within the device due to the data dependent variations in power consumption of the interpolator. While interpolators are described herein as an example device, any device that can exhibit data dependent power consumption, such as decimators or other similar devices, are well within the scope of the concepts described herein.

According to the concepts described herein, a noise generator can be employed to generate some form of dither signal. The dither signal is added to the input signal to randomize the input data. Randomizing the input data ensures that the power consumption of the device remains essentially constant regardless of fluctuations in the inputs signal. The dither signal may be made up of any type of randomized signal, such as for example, AWGN (additive white Gaussian noise), Uniform White Noise, noise FM, or any other randomized signal input. Care must be taken to ensure that the sum of the dither signal and input signal do not cause a non-linear operation such as clipping or overflow, which could result in distortion of the input signal. Any number of mechanisms could be used to prevent non-linear operation due to the sum of the input signal and dither signal exceeding the operating parameters of the device. Three examples of such mechanisms include (i) restricting the amplitude of the dither signal to ensure the sum of the input signal and dither signal remain below a threshold, (ii) adding additional bits to the data path of the summed input signal and dither signal to provide the appropriate overhead for the signal, and (iii) using two's complement arithmetic to process the summed input and dither signal. Using two's complement arithmetic does not prevent overflows, but instead overflows are circular and can be unwrapped in the subtraction of the input and dither signal. While any method may be used and is well within the scope of the invention, the preferred embodiment of the invention used two's complement arithmetic for processing the summed dither and input signals due to the ease of implementation.

An embodiment of a system and method for cancellation of data dependent power variation is shown in FIG. 2. Circuit 20 includes interpolator 100 which receives input signal 101. Instead of input signal 101 being sent directly to interpolator 100, input signal is passed through summer 207 where dither signal 202, generated by noise generator 201, is added. Combined signal 203 is sent to interpolator 100 which processes the combined signal and generates combined output signal 204. To remove the effects of the adding the dither signal to the input signal, a duplicate interpolator 200 is included and acts to process only dither signal 202 generated by noise generator 201. Dither output signal 206 from is then subtracted from combined output signal 204 using summer 208. Since duplicate interpolator 200 is identical to interpolator 100, subtracting dither output signal 206 from combined output signal 204 leaves output signal 205, which is identical to output signal 102 from FIG. 1.

While the embodiment shown by FIG. 2 would reduce data-dependent power variations, the embodiment requires duplication of the interpolation logic, which occupies more surface area of the device and at least doubles the power dissipation associated with the interpolation function.

Referring now to FIG. 3, an embodiment of a system and method according to the concepts described herein is shown that uses a constrained dither signal. For the example represented by the embodiment shown in FIG. 3, assume that dither input to the main path for interpolator 100 is constrained to plus/minus 1 scaled by a factor of $2^{-K}$. Binary noise generator 301 produces a two-valued dither signal 302, plus/minus 1, which is subsequently scaled by $2^{-K}$ using scaler 311 and multiplier 309 to produce signal 303 which is added to input signal 101 using summer 207 to produce dithered input signal 304. Generally, this dither signal would be provided by a long PN generator to make the dither signal noise-like. The input signal absolute value could now be constrained to be less than $1-2^{-K}$ to insure linear operation of interpolator 100. In this example is K is 3 or greater the loss in dynamic range is not significant. Alternatively, K may be set to 1 and one or more bits could be added to the data path width to recover the dynamic range loss.

As described above, however, the preferred embodiment uses two's complement arithmetic in summers 207 and 208. Using two's complement arithmetic also prevents non-linear operation since any overflow is circular and undone during the subsequent subtraction function. Using two's complement arithmetic could be used in association with, or possibly in place of scalers 311 and 312 and their associated multipliers 309 and 310.

The remainder of circuit 30 operates as described with circuit 20 of FIG. 2. Dither signal 302 is processed by equivalent interpolator 300 to produce signal 307, which is scaled by scaler 312 using multiplier 310 to produce signal 308. Signal 308 is subtracted from dithered output signal 302 using summer 208 to product output signal 306.

Even though dither signal 302 is bi-valued, the interpolated dither signal will be multi-valued due to the interpolation filtering. The narrower the filter bandwidth the more closely the dither effects become noise-like. For large values of N and wide fractional bandwidth interpolation filters, the response to the dither signal will transition smoothly between two dominant values. An additional difference between circuit 20 from FIG. 2 and circuit 30 from FIG. 3 is the use of an equivalent interpolator instead of a duplicate interpolator. Because of the use of a constrained dither signal 302 in circuit 30, a much simpler function can be used to emulate the response of interpolator 100 on dither signal 302.

It is apparent that equivalent interpolator 300 should match the response of interpolator 100, within some tolerance, in both amplitude and latency. In order to understand that such a simplification may be used, reference is made now to FIGS. 4, 5 and 6. FIG. 4 illustrates a conceptual depiction of an Interpolate-by-N function. Any finite-impulse-response (FIR) Interpolate-by-N function, such as 100, can, by application of the Noble Identities, be reduced to the following form shown by example 40, that is an upsampler 400 followed by an interpolation filter 403. Having developed this variation, another variation more appropriate for multistage interpolators can also be developed.

Figure 5:
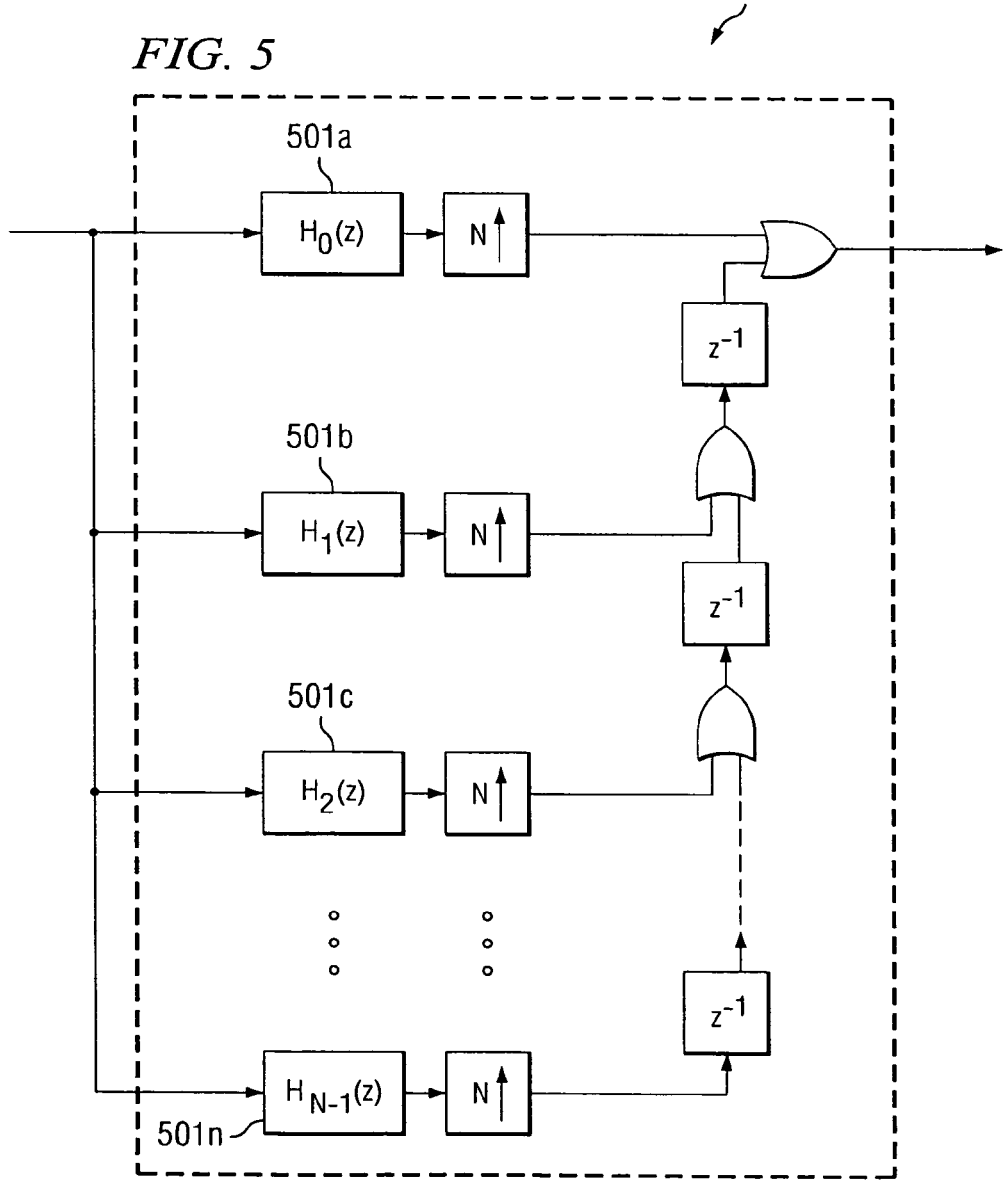
FIG. 5 is a block diagram illustrating a polyphase decomposition for an interpolate-by-N function.

Referring now to FIG. 5 a polyphase decomposition for an Interpolate-by-N function 50 is shown. While this direct form of implementation is very inefficient to implement, the polyphase decomposition may be employed to generate an equivalent filter with fewer logic resources. Each of the N sub-filters 501a-501n should operate at the input rate. The output multiplexor should also run at the output rate. If the length of the impulse response of H(z) is L, the impulse response of these sub-filters is bounded by ceil(L/N), or about $1/N^{th}$ the length of the basis interpolating filter. These sub-filters may be realized using the Direct Form representation shown in FIG. 6.

Figure 6:
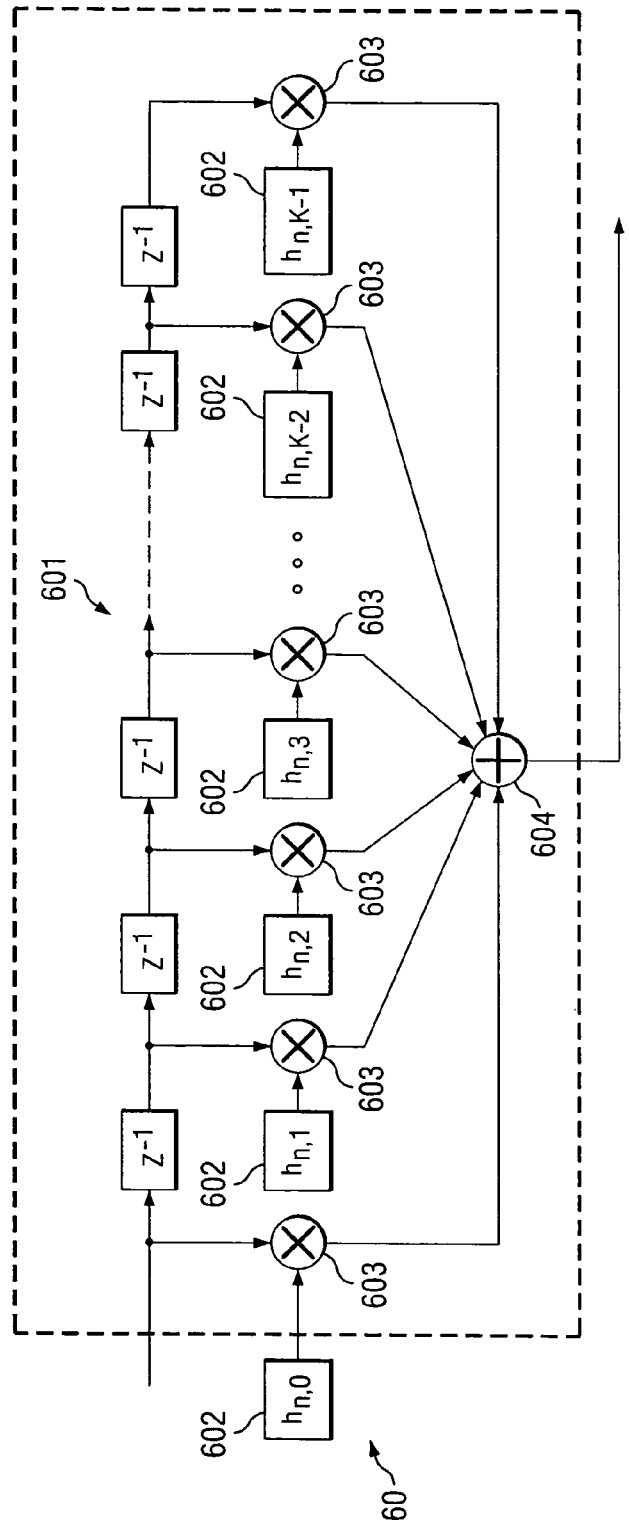
FIG. 6 is a block diagram illustrating a Direct Form realization of a sub-filter from FIG. 5.

Referring now to FIG. 6 a Direct Form realization of a sub-filter n is shown. Filter 60 includes shift register delay line 601 and coefficients 602 combined using multipliers 603. Using filter 60 the implications of the constrained dither signal may be examined. As the scaling of the dither signal has been deferred until after the dither-only filter, the input values to these filters are +/−1, which may be represented by a single bit (for example, mapping 0 represents +1, and mapping 1 represents −1), allowing shift register delay line 601 to employ single bit registers. Coefficients $h_{n,k}$ 602, are multi-bit, but the indicated multipliers have only a single bit for the multiplicands from the shift register. Hence these multiplications are in essence nothing more than adding or subtracting the filter coefficients into the indicated summation using summer 604.

These filters require no explicit multipliers, only about L single bit shift register elements and the corresponding adder trees. It is likely the primary path interpolator would require pipelining, and any latency in the pipelining should be emulated precisely. The final output is scaled by $2^{-k}$ before subtraction from the interpolated dither signal.

Figure 7:
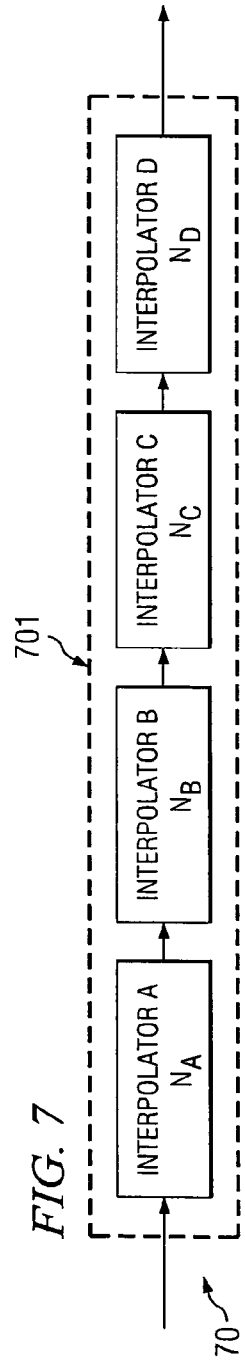
FIG. 7 is a block diagram of a multistage interpolator.

If the net interpolation factor is large it can be more efficient to realize the interpolator as a cascade of interpolators as shown in FIG. 7. Interpolator 70 is formed by cascade 701, which is this example has four individual interpolators A-D. As is obvious to one skilled in the art, any number of interpolators could be used in cascade 701 depending on the requirement of interpolator 70. In cascade 701 it would be typical for the factional bandwidth of each succeeding stage to be smaller and the impulse response shorter. The product of the interpolation factors is N.

While the application of the Noble Identities can be employed to reduce the cascade to a single stage module as previously described, it should be more beneficial to apply the dithering method independently to each stage. The benefits of the cascade approach may be the reduction of the amount of additional logic required, as well as better suppression of data-dependent power variations. The savings in the amount of logic required to implement the cascade versus the single stage would result from the reduction in the total number of taps required in the equivalent filters and from pipeline logic savings. When Noble Identities are applied to consolidate the multistage interpolator into a single stage equivalent, the impulse responses of the constituent filter's impulse responses are upsampled by inserting zeros. When these lengthened responses are convolved together the equivalent impulse response is roughly the sum of these lengthened responses. By implementing the dither scheme independently on each stage, the length of the filters required is not increased by upsampling, so the aggregate number of taps required is approximately the sum of the original lengths of the constituent filters. Also, the earlier interpolators operate at lower rates than the later filters, so less pipelining may be required in the summer trees.

As noted previously, when the fractional input bandwidth and interpolation factor is high, the response of the filters quickly transitions between two dominant values which may reduce the effectiveness of this method. This is manifested in very long equivalent impulse responses with significant amplitude content in only a region near the center. However, if the method is applied to each stage of a multistage interpolator, the interpolation factors for each stage are much smaller and the fractional bandwidths generally become smaller for each succeeding stage. This ameliorates both effects and should make data-dependent power variation suppression much more effective.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for minimizing data-dependent power variations in a device, the system comprising:
   a first signal processing function;
   a dither generator operable to produce a dither signal, the dither signal summed with an input signal to create a dithered input signal, the dithered input signal processed by the first signal processing function; and
   a second signal processing function operable to act on the dither signal and produce a compensating signal for subtracting from an output of the first signal processing function to remove effects of the dither signal from the output of the first signal processing function.

2. The system of claim 1 wherein said dither signal is either random or pseudorandom.

3. The system of claim 1 wherein the sum of the input signal and the dither signal does not result in the non-linear operation of the processing function by use of two's complement arithmetic, by adding additional bits to a processing path of the summed input signal and dither signal, or by constraining the amplitude of the dither signal.

4. The system of claim 3 wherein constraining the amplitude of the dither signal is provided by a first scaling element and a second scaling element.

5. The system of claim 1 wherein the second signal processing function is an equivalent of the first signal processing function.

6. The system of claim 1 wherein the device is a mixed signal device.

7. The system of claim 6 wherein the mixed signal device is one of a digital-to-analog converter and an analog-to-digital converter.

8. The system of claim 7 wherein at least one of the first signal processing function and the second signal processing function comprise interpolation when the mixed signal device is a digital-to-analog convener, and comprise decimation when the mixed signal device is an analog-to-digital converter.

9. A method for minimizing variations in data-dependent power variations when processing an input signal, the method comprising:
   summing the input signal with a dither signal to produce a dithered input signal;
   processing the dithered input signal to produce a dithered output signal; and
   removing effects of the dither signal from the dithered output signal to produce an output signal.

10. The method of claim 9 further comprising:
    processing the dither signal using a process equivalent to a process used to produce the dithered input signal.

11. The method of claim 10 wherein removing effects of the dither signal involves subtracting the dither signal from the dithered output signal.

12. The system of claim 9 wherein the sum of the input signal and the dither signal does not result in non-linear processing of the dither signal.

13. The system of claim 12 wherein the sum of the input signal and the dither signal does not result in non-linear processing of the dither signal by use of two's complement arithmetic, by constraining the amplitude of said dither signal, or by adding additional bits to the processing path of said summed input signal and dither signal.

14. The system of claim 13 wherein constraining the amplitude of the dither signal is provided by a first scaling element and a second scaling element.

15. The method of claim 9 wherein said dither signal is random or pseudorandom.

16. The method of claim 9 wherein the processing comprises interpolation.

17. A system for minimizing data-dependent power variations in a device receiving an input signal, the system comprising:
    a signal processing function;
    a dither generator producing a dither signal;
    a summer summing the input signal and the dither signal to produce a dithered input signal, the dithered input signal being processed by the signal processing function resulting in a dithered output signal;
    a second signal processing function processing the dither signal to produce a processed dither signal; and a second summer subtracting the processed dither signal from the dithered output signal to produce an output signal.

18. The system of claim 17 wherein the summer and the second summer use two's complement arithmetic to prevent non-linear distortions.

19. The system of claim 17 wherein the dither generator is a random noise generator or a binary noise generator.

20. The system of claim 17 wherein the second signal processing function is a duplicate signal processing function.

21. The system of claim 17 wherein the second signal processing function is an equivalent signal processing function.

22. The system of claim 17 wherein the device is a mixed signal device.

23. The system of claim 22 wherein the mixed signal device is a digital-to-analog converter or an analog-to-digital converter.

24. The system of claim 23 wherein the signal processing function comprises interpolation when the mixed signal device is a digital-to-analog converter and wherein the signal processing function comprises decimation when the mixed signal device is an analog-to-digital converter.

* * * * *

UNITED STATES PATENT AND TRADEMARK OFFICE
CERTIFICATE OF CORRECTION

| | |
|---|---|
| PATENT NO. | : 7,626,721 B2 |
| APPLICATION NO. | : 11/546791 |
| DATED | : December 1, 2009 |
| INVENTOR(S) | : George S. Moore et al. |

Page 1 of 1

It is certified that error appears in the above-identified patent and that said Letters Patent is hereby corrected as shown below:

In column 6, line 23, in Claim 8, delete "convener," and insert -- converter, --, therefor.

Signed and Sealed this

Seventeenth Day of August, 2010

David J. Kappos
*Director of the United States Patent and Trademark Office*